United States Patent [19]

Kitagawa et al.

[11] 4,393,475
[45] Jul. 12, 1983

[54] NON-VOLATILE SEMICONDUCTOR MEMORY AND THE TESTING METHOD FOR THE SAME

[75] Inventors: Norihisa Kitagawa; Eisaburo Iwamoto, both of Tokyo, Japan

[73] Assignee: Texas Instruments Incorporated, Dallas, Tex.

[21] Appl. No.: 229,027

[22] Filed: Jan. 27, 1981

[51] Int. Cl.³ .............................................. G11C 11/40
[52] U.S. Cl. .................................... 365/201; 365/207; 365/185
[58] Field of Search .............. 365/174, 182, 185, 201, 365/207, 208, 210, 212, 222; 371/21; 324/73 R, 158 R

[56] References Cited

U.S. PATENT DOCUMENTS 4,301,518 11/1981 Klaas .................................. 365/207

OTHER PUBLICATIONS

E. C. Jacobson, IBM Tech. Discl. Bulletin, vol. 19, No. 11, Apr. 1977, pp. 4197-4198.

Primary Examiner—Joseph A. Popek
Attorney, Agent, or Firm—Douglas A. Lashmit; Rhys Merrett; Melvin Sharp

[57] ABSTRACT

A nonvolatile semiconductor memory device formed of a plurality of memory cells arranged in a matrix pattern includes a plurality of reference cells, a reference voltage supply, and differential type sensing amplifiers connected to output lines of the memory cells and to an output line of the reference cells. In one embodiment the storage capability of each memory cell is tested by comparing the cell voltage to the reference voltage by selectively connecting the reference cell output line with the sensing amplifier associated with the column containing the cell under test. A memory cell is determined to be defective when the difference between the cell voltage and the reference voltage, that is, the output of the differential sensing amplifier, is below a predetermined value.

3 Claims, 7 Drawing Figures

NON-VOLATILE SEMICONDUCTOR MEMORY AND THE TESTING METHOD FOR THE SAME

BACKGROUND OF THE INVENTION

This invention relates to a nonvolatile semiconductor memory device, and to a test logic circuit therefore; and more particularly to a test logic circuit which can easily select only those cells having a high level of data storage among a plurality of nonvolatile memory cells and which can be easily formed on the same semiconductor chip together with the nonvolatile memory cells.

Elements including a floating gate composed of a polycrystalline semiconductor layer surrounded by an insulator such as silicon oxide have heretofore been widely utilized as nonvolatile memories. Although these elements are called "nonvolatile", the charge stored in the floating gate leaks gradually over a long period of time. It may be due to its gate structure, electric field and temperature; and also due to the presence of, for example, a path of current leakage. Especially, defects present locally or randomly in the insulator provide the source of the leakage current path, and complete elimination of these defects has been impossible in spite of efforts of those skilled in the art over long years.

Accordingly, it is an important matter how products having a satisfactory memory holding characteristics can be accurately selected.

A selecting test commonly employed heretofore is based on a method in which a semiconductor memory device is tested under a high-temperature condition and the data holding time under a temperature condition lower than the testing temperature is determined by extrapolation on the basis of the activation energy curve. However, this method has had the following limitations and has not been fully satisfactory:

(1) The temperature in the test is limited by the material of the package of the semiconductor memory device and also by the temperature of the PN junction in the semiconductor. The duration of the test must be extended when the test is carried out at a low temperature to avoid the above problem. As a matter of fact, satisfactory estimation of the data holding time has been impossible in view of the allowable temperature range of the plastics widely employed as the material of the package.

This prior art method is based upon a presumption of a level of activation energy. Therefore, in the event of a variation of the presumed activation energy, estimation at high temperatures becomes extremely inaccurate to the extent that the method is not usable anymore.

According to this method, the storage voltage in the memory cell cannot be directly read, and because of the parasitic noise generated from, for example, the input-/output resistor, the estimation of the data holding time becomes difficult more and more and the method may not be executed.

SUMMARY OF THE INVENTION

In view of these situations, the present invention provides a nonvolatile semiconductor memory having a high reliability.

It is a first object of the present invention to provide a nonvolatile semiconductor memory device in which the data storage characteristic of its nonvolatile semiconductor memory cells can be accurately tested and which has a high reliability and also to provide a method of testing the same.

Another object of the present invention is to provide a logic circuit and method for testing the data storage characteristic of a nonvolatile semiconductor memory cell by employing a reference cell, applying a reference voltage to the reference cell, and comparing the output from the memory cell with the output from the reference cell. This logic circuit may be so connected that a sensing amplifier circuit provided for the normal reading operation on the memory can also be used as the test circuit, or it may be separately provided. In the former instance the sensing amplifier circuit is used in the test mode by means of a test mode select signal applied to a switching circuit connected to the reference voltage output lines and to the inputs of the sensing amplifier circuit.

Still another object of the present invention is to provide a test logic circuit and a testing method in which the data storage voltage can be directly examined by selecting a reference voltage having a level between the threshold voltage of the insulated-gate FET or sensing transistor in the memory cell and the voltage stored in the memory cell as a result of writing of a data therein to thereby accurately test the data storage time of the cell within a short period of time.

BRIEF DESCRIPTION OF THE DRAWINGS

Other objects and advantages of the present invention will become apparent, and the invention will be better understood, by reference to the following detailed description and claims when read in conjunction with the following drawings, wherein:

FIG. 7 is a block diagram showing a second embodiment of the present invention wherein each memory cell includes a single floating gate for data storage.

DETAILED DESCRIPTION OF THE PREFERRED EMBODIMENTS

Figure 1:
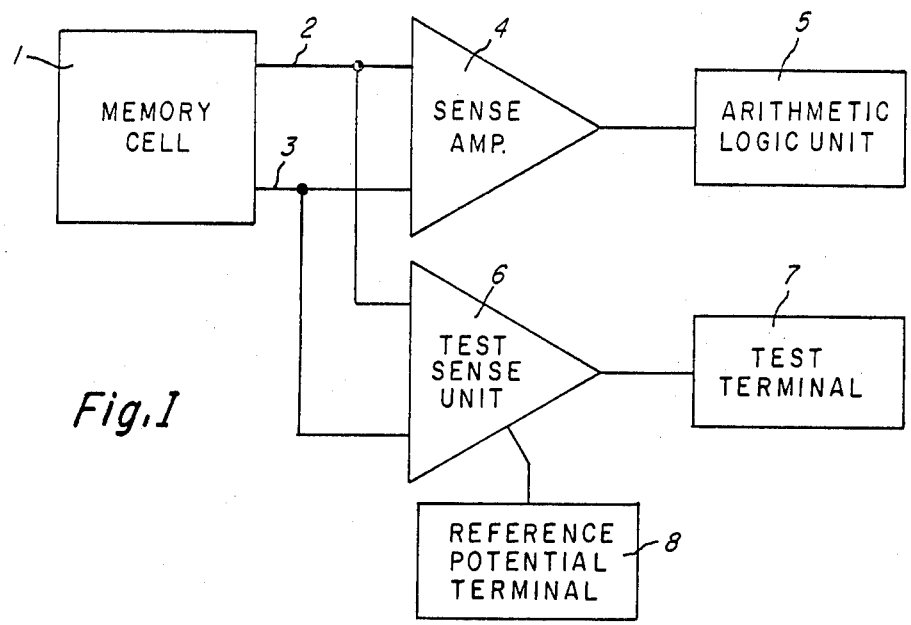
FIG. 1 is a block diagram of a basic logic circuit for testing a nonvolatile semiconductor memory device according to the present invention.

Nonvolatile memories and sensing amplifiers are arranged in matrix pattern in a monolithic integrated circuit together with a calculation-purpose logic unit executing various calculations using information stored in the memories. FIG. 1 is a block diagram illustrating the concept of the present invention, and the numeral 1 designates one column of nonvolatile memory cells among those arranged in matrix pattern. Data lines 2 and 3 for the memory cell column 1 are connected to an arithmetic logic unit 5 through a sensing amplifier unit 4.

The data lines 2 and 3 for the memory cell column 1 are further connected to a test terminal 7 through a test sensing amplifier 6. A reference potential terminal 8 is connected to sensing amplifier 6 for adjusting and controlling the sensitivity of the amplifier.

In FIG. 1, the sensing amplifier 4 used in the normal mode is shown provided separately from the sensing amplifier 6. However, they may be separate units or the former may also be operated to serve the function of the latter as described later.

Figure 2:
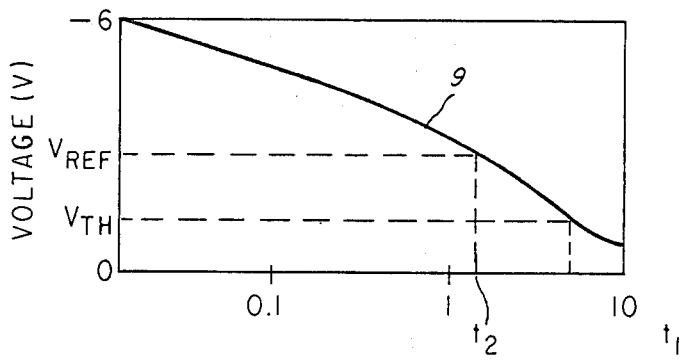
FIGS. 2 and 3 are graphic representations of the storage voltage as a function of time for a typical p-channel MOS transistor.

The curve 9 in FIG. 2 shows how the storage voltage of a unit memory cell attenuates with time when the unit memory cell includes a single floating gate. The horizontal axis represents the relative time and the vertical axis represents the storage voltage. It will be seen from the curve 9 that the storage voltage of a memory cell is about −6 volts as a result of writing of data therein, and within the temperature range of from the room temperature to about 70° C., the absolute value of the storage voltage decreases with time to, for example, about one-half of its initial value in about one year (one day under a superheated condition) and to a level close to the threshold voltage $V_{th}$ of the sensing transistor in ten years (ten days under the superheated condition). FIG. 2 shows the storage voltage relative to time in the case of a p-channel MOS transistor. According to the present invention, the storage voltage of a memory cell is examined with a sensing amplifier whose sensitivity is reduced by application of a reference voltage $V_{ref}$ so as to distinguish between a defect-free memory cell and a defective memory cell within a short period of time. Describing the example shown in FIG. 2, the reference voltage $V_{ref}$ is not applied to a sensing amplifier at the time t1 but applied thereto at the time t2 far earlier than that, and when the storage voltage of a memory cell at that time is higher than the reference voltage $V_{ref}$, the memory cell is proved to be defect-free, while when the storage voltage is lower than the reference voltage $V_{ref}$, the memory cell is proved to be defective.

Figure 3:
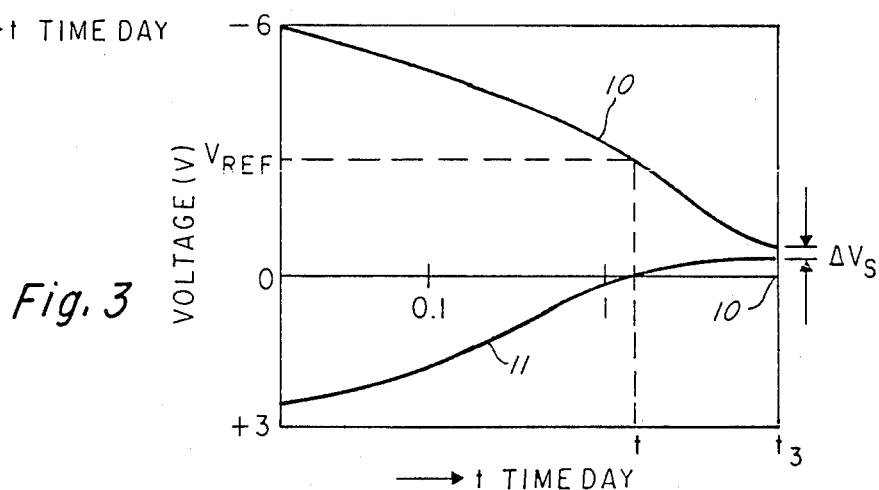

FIG. 3 shows by the curves 10 and 11 how, in a structure of a unit memory cell including two floating gates, the storage voltages of the respective gates attenuate with time. This memory cell is so constructed that the voltage difference between the two floating gates, to which respectively opposite potentials are applied, improves the data storage time compared with that of the prior art memory cell including the single floating gate. In the illustrated example, therefore, a reference voltage $V_{ref}$ higher than the minimum sensing voltage ($\Delta Vs$) of the sensing amplifier unit 4 is applied to the sensing amplifier 6, and when the potential difference between the two floating gates is larger than this reference voltage $V_{ref}$, the memory cell is proved to be defect-free, while when the potential difference is smaller than the reference voltage $V_{ref}$, the memory cell is proved to be defective. As a result, whether the memory cell is defect-free or defective can be judged at the time t4 without continuing the test to the time t3.

The horizontal axes in FIGS. 2 and 3 represent the relative times depending on the temperature condition under which the test is executed. For example, under the temperature condition of about 130° C., t1 and t3 correspond to about ten days, and t2, t4 correspond to about one day.

The optimum value of the reference voltage $V_{ref}$ is determined taking into account the settings of the measuring times t2, t4 together with the accuracy of the test.

It will thus be seen that, in the test logic circuit according to the present invention, the reference voltage $V_{ref}$ applied to the sensing amplifier unit or sensing amplifier placed in the test mode is selected to be higher in absolute value than the sensing voltage of the read sensing amplifier or sensing amplifier placed in the read mode. In other words, the sensitivity of the sensing amplifier is reduced, and the storage voltage of a memory cell or a voltage corresponding thereto is measured to that the storage capability of the memory cell can be accurately measured within a short period of time.

Figure 4:
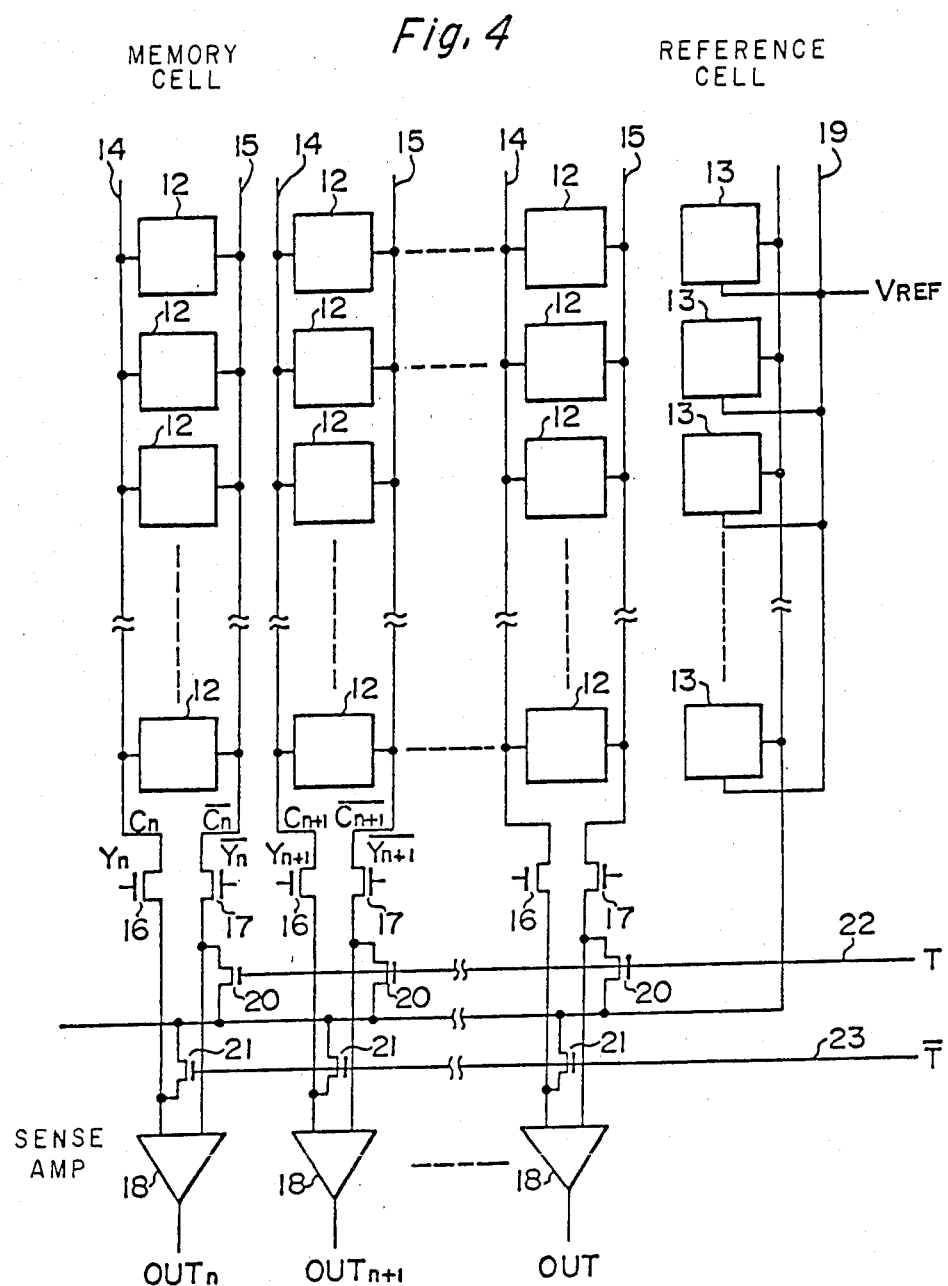
FIG. 4 is a schematic diagram showing one embodiment of the present invention wherein each memory cell includes two floating gates for data storage.

FIG. 4 shows one of embodiments of the present invention and illustrates application of the present invention to memory cells in which each unit memory cell includes two floating gates, and the potential difference between the two floating gates, to which respectively opposite potentials are applied, provides memory data.

M×N memory cells 12 are arranged in matrix pattern, and M columns each of which is composed of N memory cells are connected as shown. N reference memory cells 13 formed by the same manufacturing process are disposed outside of the rightmost column of the memory cells 12. In the actual wiring arrangement, write/erase lines and read lines run in the transverse direction in FIG. 4 or in the direction orthogonal with respect to data lines 14 and 15. These lines are, however, not shown for the sake of clarity.

Respectively opposite polarity signals are applied to the data lines 14 and 15 connected to the memory cells 12. More precisely, a data signal $\overline{Cn}$ is applied to the data line 14 connected to an nth column, while a data signal Cn is applied to the data line 15 connected to the same column. An insulated-gate FET 16 is connected to the leftmost data line 14, and a signal Yn is applied to the gate thereof. Similarly, an insulated-gate FET 17 is connected to the leftmost data line 15, and a signal Yn opposite in polarity to the signal Yn is applied to the gate thereof. These two FET's 16 and 17 are to the input lines respectively of a differential type sensing amplifier 18. Connections similar to those above described are provided for the remaining memory cell columns.

A reference voltage $V_{ref}$ is applied to each of the N reference cells 13 disposed of the M×N memory cells 12. As described below, the reference cells 13 have a structure less than one-half of that of the memory cells 12, and there is a single reference data line 19. This reference data line 19 is connected to the data lines 14 and 15 of each column through insulated-gate FET's 20 and 21, respectively, and test-mode signals T and $\overline{T}$ are applied to the gates of these FET's 20 and 21 via test-mode select lines 22 and 23, respectively. The test-mode select line 22 is connected to the gates of the FET's 20 of all the columns, and the other test-mode select line 23 is connected to the gates of the FET's 21 of all the columns, so that the test-mode signal T and the signal $\overline{T}$ opposite in polarity to the signal T can be applied in common to select either the normal read mode or the test mode. In other words, in this embodiment, a single differential type sensing amplifier performs the functions of the two sensing amplifiers 4 and 6 in FIG. 1, and these two functions are switched over by these test-mode select signals T and $\overline{T}$. By virtue of the above arrangement, the test logic circuit can be efficiently provided on the same semiconductor substrate together with the memory circuit.

Figure 5:
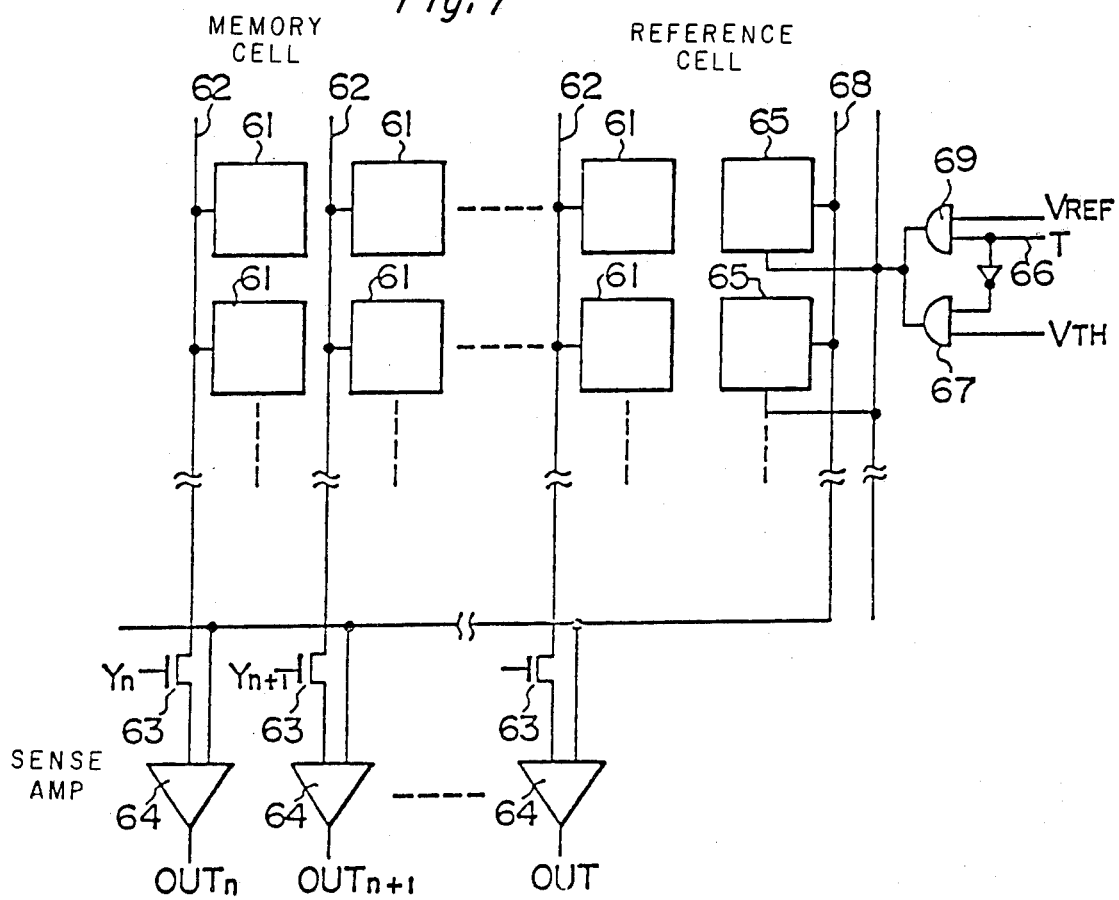
FIG. 5 is a logic table showing the logic states in the circuit of FIG. 4.

FIG. 5 is a table showing the logic states in the embodiment shown in FIG. 4. At first, the normal read mode will be described. To read the data stored in a desired one of the memory cells in a desired one of the columns, an associated one of the data read lines (the row address line) is selected, and the output from the memory cell appears on the data lines 14 and 15. In the read mode, the test-mode select lines 22 and 23 are kept in their off-state ($T=0$, $\overline{T}=0$). The column from which the data is to be read out is selected by the column address signal. For example, the signals $Yn=1$ and $\overline{Yn}=1$ are applied to place the data lines of the nth column in their on-state, and the signals such as $Yn+1=0$ and $\overline{Yn+1}=0$ are applied to disconnect the remaining columns from the differential type sensing amplifiers 18 so that the data from the memory cell in the nth column can be selectively read out. In order to read the data from one of the memory cells in the next or (n+1)th column, the signals $Y=0$, $\overline{Y}=0$, $Yn+1$ and $\overline{Yn+1}=1$ as shown in FIG. 5 are applied to read out the data $Cn+1$ from the memory cell in the (n+1)th column. The data $Cn$ and $Cn+1$ are applied to the associated differential type sensing amplifiers 18 to appear at the amplifier output terminals $OUTn$ and $OUTn+1$, respectively.

The mode of the test for measuring the data holding time according to the present invention will be explained with reference to FIGS. 4 and 5. Under a predetermined temperature condition, one of the memory cells 12 to be tested is selected by the row address signal applied via the row address line (not shown) and by the column address signal $Yn$, $\overline{Yn}$, $Yn+1$, $\overline{Yn+1}$ or the like. When the selected memory cell is included in the nth column and the data $Cn$ appearing on the associated data line 14 is to be tested, a logic "1" is applied to $Yn$ and $T$, while a logic "0" is applied to the remaining column select lines such as $\overline{T}$ and others, thereby turning on only the two FET's 16 and 20 associated with the nth column. The output voltage from the reference cell 13 having the reference voltage $V_{ref}$ applied thereto is applied via the reference data line 19 and the FET 20 of on-state to the sensing amplifier 18 placed in the test mode together with the output $Cn$ from the memory cell 12 being tested. In this differential type sensing amplifier 18, the output voltage $Cn$ from the memory cell 12 being tested is compared with the output voltage from the reference cell 13 so as to judge whether the memory cell 12 is defect-free or defective.

Then, when the data $\overline{Cn}$ appearing on the data line 15 is to be tested, a logic "1" is applied to $\overline{Yn}$ and $\overline{T}$, while a logic "0" is applied to the other lines, thereby turning on only the remaining two FET's 17 and 21 associated with the nth column. The output voltage from the reference cell 13 having the reference voltage $\overline{V_{ref}}$ applied thereto is applied via the reference data line 19 and the FET 21 of on-state to the sensing amplifier 18 placed in the test mode together with the output voltage $\overline{Cn}$ from the memory cell 12 being tested. Similarly, in this differential type sensing amplifier 18, the output voltage $\overline{Cn}$ from the memory cell 12 being tested is compared with the output voltage from the reference cell 13 so as to judge whether the memory cell 12 is defect-free or defective.

By the selective actuation of the row select lines and column select lines, all of the M×N memory cells 12 can be successively tested in the manner similar to that above described. Although FIG. 5 show merely the logic states of the signals used in the test for the memory cells in the nth and (n+1)th columns, the manner of testing the other memory cells will be readily understood by those skilled in the art.

Figure 6:
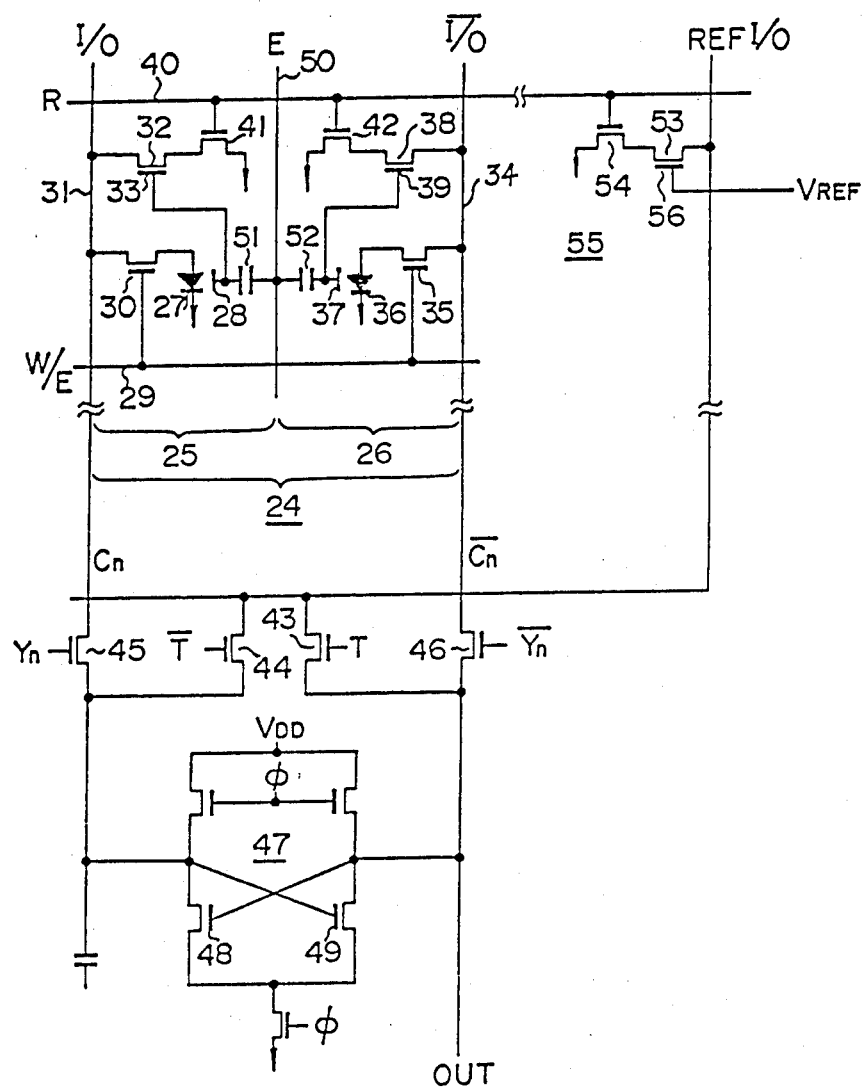
FIG. 6 is a schematic diagram showing in detail the structure of one of the memory cells of FIG. 4.

FIG. 6 shows in detail the structure of one of the unit memory cells in the nonvolatile semiconductor memory device shown in FIG. 4. The data read operation, write operation and erase operation will now be described.

The unit memory cell 24 comprises two subcells 25 and 26 symmetrical with each other, and the first subcell 25 includes an electron-hole injector diode 27 and a floating gate 28 isolated from the diode 27 by a thin insulator layer. The floating gate 28 has no electrical connection with an external terminal and is electrically floating. In order to write data in this floating gate 28, a negative high potential is applied to a write/erase X line 29 to turn on an X-address transistor 30, and a negative high potential is applied from an input/output Y line 31 to the PN junction of the injector diode 27. When a sufficiently high reverse bias of, for example, 18 volts is applied across this junction to cause avalanche breakdown in the junction, the injector diode 27 produces a plasma of hot electrons, and some of the electrons migrate through the thin silicon oxide film covering the junction to be injected into and arrested by the floating gate 28. This electron injection continues until the electric field built up by the injected carriers obstructs any further injection of the electrons. The floating gate 28 of the injection diode 27 is connected by an internal wiring to a floating gate 33 of a sensing transistor 32. The aforementioned electric field built up by the injected electrons is programmed to turn the sensing transistor 37 into its off-state.

As described above, a negative high voltage (a logic "1") is applied to the first input/output Y line 31 (I/O in FIG. 6). On the other hand, a logic "0" opposite to the logic "1", that is, a ground potential is applied to a second input/output-purpose Y line 34 $\overline{I/O}$ in FIG. 6, associated with the second subcell 26. Therefore, even when an X-address transistor 35 in the second subcell 26 may be turned on due to the application of the negative high voltage to the write X line 29, no reverse bias is applied across the junction of an injector diode 36 connected thereto, and no electrons are injected into its floating gate 27. As a result, no change occurs in the electric field built up in a floating gate 39 of a sensing transistor 38 in the second subcell 26, and the sensing transistor 38 is programmed to be turned into its on-state.

Such a programmed writing operation is carried out by selecting an address line connected to a memory cell in which data is to be written, after data stored in all the memory cells have been erased.

Due to the fact that the two floating gates 33 and 39 have no electrical connections with external terminals, the on-state or off-state thereof is maintained unless the erasing operation is performed after removal of the voltages applied to the write X line and input Y lines. The floating gates 28, 33, 37, 39 and the internal wiring interconnecting them may be a layer of a metal such as aluminum or may be a layer of polycrystalline silicon rendered electrically conductive.

The data stored in the memory cell 24 is read out by selecting the memory cell 24 applying a negative high potential to a read Y line 40 and turning on both of an address transistor 41 in the first subcell 25 and an address transistor 42 in the second subcell 26. When the data has already been written in the memory cell 24 shown in FIG. 6, the sensing transistor 32 in the first subcell 25 is in its off-state, while the sensing transistor 38 in the second subcell 26 is in its on-state. Therefore, a negative high potential or a logic "1" appears on the output Y line 31, while a ground potential or a logic "0" appears on the other output Y line 34.

In the normal read mode, test-mode select signals T and T̄ are applied to turn off test-mode select transistors 43 and 44, while column select signals Yn and Ȳn are applied to turn on column select transistors 45 and 46. In response to application of these select signals, the output C̄n (a logic "1" in the above case) appearing on the output Y line 31, and the output Cn (a logic "0" in the above case) appearing on the output Y line 34 are applied to a differential type sensing amplifier 47. This sensing amplifier 47 is a high-sensitivity differential type amplifier including a pair of transistors 48 and 49, the symbols Vdd and φ in FIG. 1 designate a power source and a clock input respectively. In the process of reading of the output from the memory cell 1 in the manner above described, the data stored in the memory cell 24 can be accurately read in spite of its time-dependent attenuation as far as the difference between the storage voltages provided by the charges stored in the floating gates 33 and 39 in the first and second subcells 25 and 26, respectively, is larger than the minimum sensitivity ΔVs (for example, 50 mV–300 mV) of the sensing amplifier 47. In other words, the data holding time of the memory cell can be extended compared with that of prior art ones.

The data stored in the memory cell 24 is erased in a manner as described below. A negative high voltage (a logic "1") is applied to the erase X line 29 and Y line 50 and also to the input/output Y lines 31 and 34. The address transistors 30 and 35 are turned on, and due to the application of the high voltage to the Y lines 31 and 34, avalanche breakdown occurs in the injector diodes 27 and 36, thereby producing a plasma. However, due to the fact that this erase mode differs from the aforementioned write mode in that the negative potential of the erase Y line 50 is applied indirectly to the floating gates 28 and 37 through bootstrap capacitors 51 and 52 holes in the produced plasma migrate through the thin insulator film and are injected into the floating gates 28 and 37 to be recombined with the electrons stored therein. As a result, the sensing transistors 32 and 38 are both turned on to erase the data stored in the memory cell 24.

The test for examining the data holding characteristics of the memory cell in the embodiment shown in FIG. 6 is carried out in a manner similar to that described with reference to FIGS. 4 and 5.

Each of a plurality of reference cells 55 comprises a reference sensing transistor 53 fabricated concurrently with sensing transistors 33 and 38 in the memory cell 24 and having a gate insulator layer formed under the same condition and a reference address transistor 54 connected to the sensing transistor 53. Reference cells 55 are formed in an arrayed relation with the number equal to the number of rows of the memory cells of matrix arrangement. Theoretically, only one reference cell 55 is required for the array of memory cells. However, when the improvement in the accuracy of the test and the balance of the integrated circuit are taken into consideration, it is preferable that the number of the reference cells 55 be equal to the number of rows of the memory cells as shown in the embodiment, and the reference address transistors 54 operate in synchronism with the address transistors 41 and 42 in the memory cells under control of the read X lines 40 the number of which is equal to the number of rows of the memory cells.

Another important feature is that a reference voltage $V_{ref}$ is applied to the gate 56 of the sensing transistor 53 in each of the reference cells 55. When the integrated circuit includes p-channel insulated-gate FET's as in the present embodiment, this reference voltage $V_{ref}$ is a predetermined negative voltage lower in absolute value than the initial write voltage applied to the floating gate 33 in the memory cell 24.

In the test mode, the storage data outputs Cn and C̄n from the respective subcells 24 and 25 are compared in the sensing amplifier 47 with the output from the reference cell 55 in a manner entirely similar to that described in regard to the selected memory cell with reference to FIGS. 4 and 5.

FIG. 7 shows an embodiment in which the present invention is applied to a nonvolatile memory device comprising unit memory cells, each including a single floating gate. As in FIG. 4, M×N memory cells 61 are arranged in matrix pattern, and those in each column are connected at their outputs to a data line 62 which terminates in one of the output terminals of a differential type sensing amplifier 64 through a column select FET 63.

N reference cells 65 are disposed outside of the rightmost column of the memory cells 61 adjacent thereto. As in the previous embodiment, it is preferable that the number of reference cells 65 be equal to the number N of rows of the memory cells 61 for improved accuracy.

In this second embodiment, the normal read operation is carried out in a manner as described below. A logic T=0 is applied to a test-mode select line 66, and the threshold voltage $V_{th}$ of the sensing amplifier is applied to one of the reference cells 65 through a normal-mode multiplexer 67. The output from the reference cell 65 is applied via a reference input/output line 68 to one of the sensing amplifiers 64, in which the output from the reference cell 65 is compared with the output from the memory cell 61 thereby reading out the data. The rows and columns are selected to read out the data from the required memory cells.

The storage voltage test operation in this embodiment is carried out in a manner as described below. A logic T=1 is applied to the test-mode select line 66, and, instead of the aforementioned threshold voltage $V_{th}$, the reference voltage $V_{ref}$ is applied to one of the reference cells 65 through another multiplexer 69. As in the first embodiment, the output from the selected memory cell 61 is compared in the sensing amplifier 64 with the output from the reference cell 65 applied via the reference input/output line 68 to determine the relative levels of the reference voltage $V_{ref}$ and the storage voltage of the memory cell 61. The rows and columns are sequentially selected until all of the memory cells are tested.

In the aforementioned embodiments, a common sensing amplifier is used in both of the normal data read mode and the test mode. Therefore, although the two kinds of sensing amplifiers 4 and 6 in FIG. 1 are shown, a single sensing amplifier can serve the dual functions in an actual circuit arrangement, and the increase in the number of semiconductor elements as well as the increase in the area occupied thereby attributable to the additional integration of the test logic circuit in the nonvolatile memory device is so negligible that it does not pose any problem. It will be apparent that, provision of the two kinds of sensing amplifiers as shown in the basic structural diagram of FIG. 1 is effective when there is a marginal allowance in the factors of design.

We claim:

1. A system for determining the storage capability of each cell in a nonvolatile semiconductor memory device formed of an array of rows and columns of memory cells comprising:
   one or more reference memory cells;
   a reference voltage supply connected to said reference memory cells, wherein said reference voltage is greater than the threshold voltage and less than the storage voltage of said memory cells;
   a plurality of differential sense amplifiers;
   means for selectively coupling each column of memory cells to one input of a corresponding one of said plurality of differential sense amplifiers; and
   means for selectively coupling one or more of said reference memory cells to the other input of each of said plurality of differential sense amplifiers, wherein the output of the selected differential sense amplifier is related to the storage capability of a selected memory cell.

2. The system of claim 1 wherein each of said memory cells includes two electrically floating gates for charge storage thereon, said floating gates being coupled through said column selective coupling means to the inputs of a corresponding one of said plurality of differential sense amplifiers.

3. The system of claim 1, further comprising:
   a threshold voltage supply; and
   means for coupling said threshold voltage supply to said reference memory cells during normal operation of said nonvolatile semiconductor memory device.

* * * * *